US006633181B1

(12) United States Patent  (10) Patent No.: US 6,633,181 B1
Rupp  (45) Date of Patent: Oct. 14, 2003

(54) MULTI-SCALE PROGRAMMABLE ARRAY

(75) Inventor: Charle' R. Rupp, Morgan Hill, CA (US)

(73) Assignee: Stretch, Inc., Mountain View, CA (US)

( * ) Notice: Subject to any disclaimer, the term of this patent is extended or adjusted under 35 U.S.C. 154(b) by 0 days.

(21) Appl. No.: 09/475,400

(22) Filed: Dec. 30, 1999

(51) Int. Cl.⁷ .......................................... H03K 19/177
(52) U.S. Cl. .......................................... 326/40; 326/46
(58) Field of Search .............................. 326/37–41, 46, 326/47, 49, 44

(56) References Cited

U.S. PATENT DOCUMENTS

| | | | |
|---|---|---|---|
| 5,258,668 A | 11/1993 | Cliff et al. | 326/41 |
| 5,260,610 A | 11/1993 | Pedersen et al. | 326/41 |
| 5,260,611 A | 11/1993 | Cliff et al. | 326/39 |
| 5,274,581 A | 12/1993 | Cliff et al. | 364/784 |
| 5,343,406 A * | 8/1994 | Freeman et al. | 716/16 |
| 5,357,152 A | 10/1994 | Jennings, III | |
| 5,414,377 A * | 5/1995 | Freidin | 326/41 |
| 5,426,378 A * | 6/1995 | Ong | 326/39 |
| 5,436,574 A | 7/1995 | Veenstra | |
| 5,726,584 A * | 3/1998 | Freidin | 326/38 |
| 5,742,180 A | 4/1998 | DeHon et al. | |
| 5,920,202 A | 7/1999 | Young et al. | 326/39 |
| 5,926,036 A | 7/1999 | Cliff et al. | 326/40 |
| 5,963,050 A | 10/1999 | Young et al. | 326/41 |
| 5,977,793 A | 11/1999 | Reddy et al. | 326/41 |
| 5,982,195 A | 11/1999 | Cliff et al. | 326/41 |
| 5,986,465 A | 11/1999 | Mendel | 326/39 |

FOREIGN PATENT DOCUMENTS

| | | |
|---|---|---|
| EP | 0 507 507 | 10/1992 |
| EP | 0 668 659 | 2/1995 |

OTHER PUBLICATIONS

Bechade, R.A. et al., "Programmable Arithmetic/Logic Circuit," IBM Technical Disclosure Bulletin, U.S. IBM Corp., New York, vol. 3, No. 11, Apr. 1981, pp. 4870–4873, XP–000713711.

* cited by examiner

Primary Examiner—Michael Tokar
Assistant Examiner—James H Cho
(74) Attorney, Agent, or Firm—Carr & Ferrell LLP

(57) ABSTRACT

A novel architecture for a multi-scale programmable logic array (MSA) to be used in the design of complex digital systems allows digital logic to be programmed using both small-scale blocks (also called gate level blocks) as well as medium scale blocks (also called Register Transfer Level or RTL blocks). The MSA concept is based on a bit sliceable Arithmetic Logic Unit (ALU). Each bit-slice may be programmed to perform a basic Boolean logic operation or may be programmed to contribute to higher-level functions that are further programmed by an ALU controller circuit. The ALU controller level in this new approach also allows the primitive logic operations computed at the bit-slice level to be combined to perform complex random logic operations. The data shifting capability of this new programmable logic architecture reduces the complexity of the programmable routing needed to implement shift operations including multiplier arrays. The new array also allows logic variables under program control to dynamically modify the microprogram of each ALU. This technique is called configuration overlay and simplifies the programming of complex arithmetic and random logic functions.

15 Claims, 13 Drawing Sheets

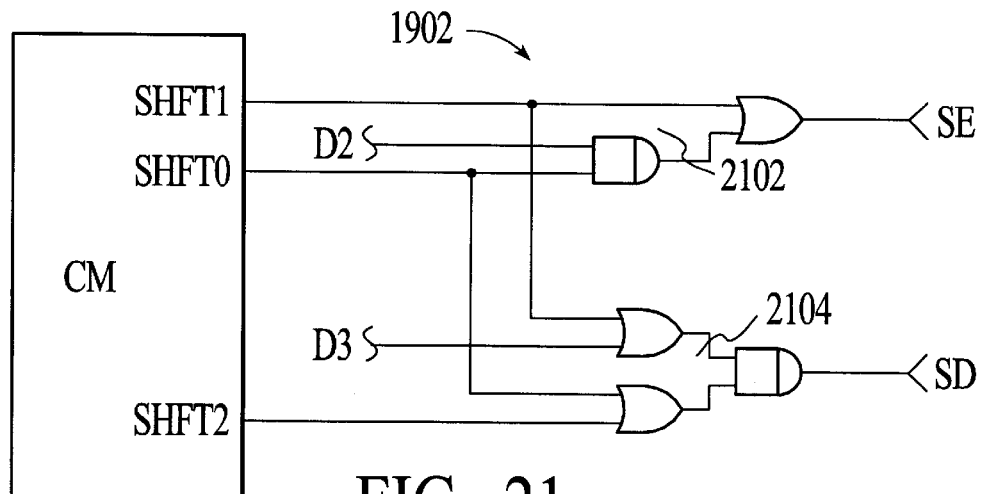
FIG. 21
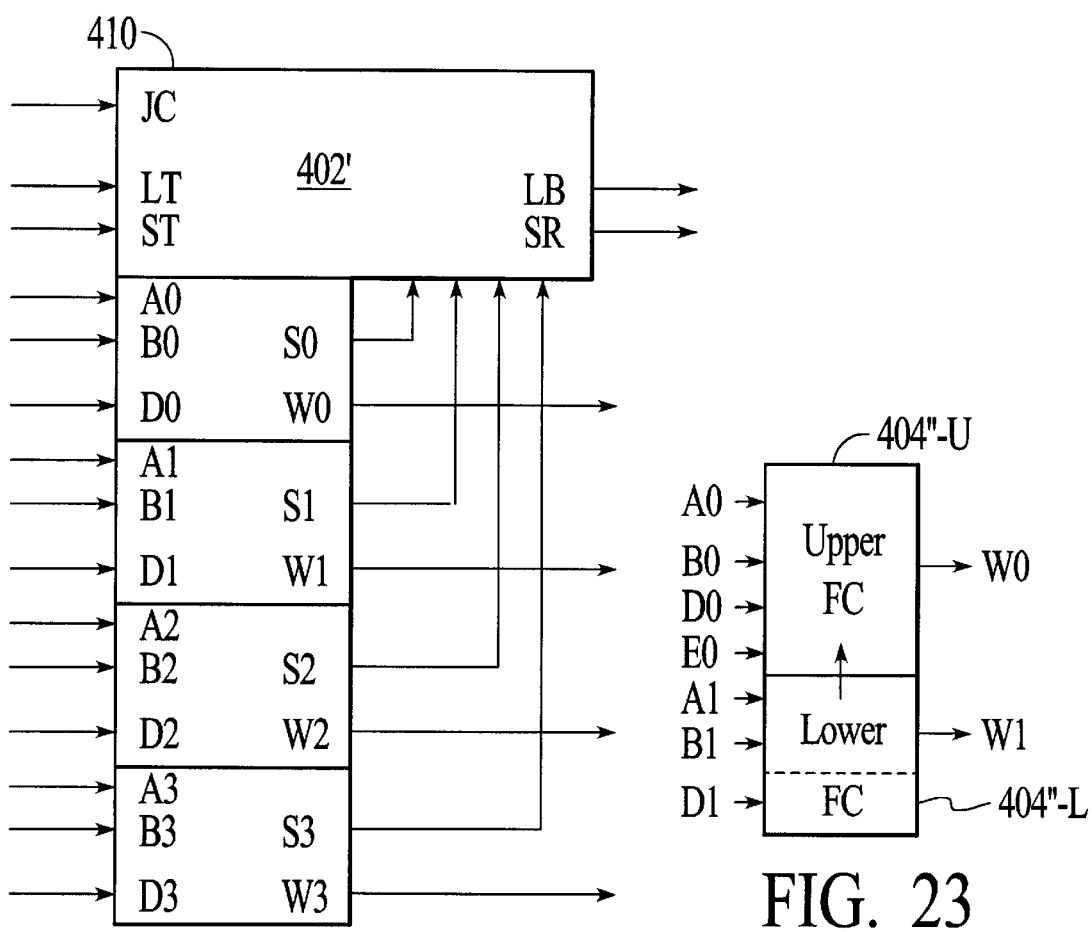
FIG. 22
FIG. 23

MULTI-SCALE PROGRAMMABLE ARRAY

BACKGROUND OF THE INVENTION

1. Field of the Invention

The present invention relates to the field of Programmable Logic Arrays (PLAs), Field Programmable Gate Arrays (FPGAs) and Programmable Logic Devices (PLDs). More particularly, the present invention relates to a programmable logic array architecture in which individual logic elements are based on a bit sliceable arithmetic logic unit (ALU), each bit slice being individually programmable to perform low-level Boolean and gate-level operations, as well as higher-level logic and arithmetic functions.

2. Description of the Related Art

FIG. 1 illustrates a programmable logic element 100 used in a conventional programmable logic device. Typically, a logic device includes a two-dimensional array of elements such as element 100 disclosed in U.S. Pat. No. 5,274,581.

As shown, element 100 implements a four-input look-up table 102 which is programmable to produce a desired binary output signal value for each of the sixteen possible combinations of its four binary input signals A, B, C and D. When element 100 is to be used as one stage of a two-input adder or subtracter, a four-input look-up table is much more than is needed to provide just a sum out or carry value. Accordingly, the four-input look-up table is provided as shown in FIG. 1 as two three-input look-up tables 104, 106 so that the one element 100 can provide both a sum out on its normal output, and important precedents to the carry out value on outputs X and Y.

Element 100 also provides further inputs and outputs that enable its use as one place in a binary operation such as addition, subtraction or counting. Specifically, element 100 includes a carry in input, typically from the carry out output of another adjacent logic element. Element 100 further includes a cascade connect input, also typically from another adjacent logic element, which can allow the cascade connect output from the adjacent logic element to be combined with the output of the look-up table in element 100 if desired. In addition to its regular data output from driver 108, element 100 includes a cascade connect output, which typically is applied to the cascade connect input of an adjacent logic element. A carry out signal is similarly applied to the carry in input of another, typically adjacent logic element.

FIG. 2 illustrates how the four-input look-up table 102 of element 100 is realized as two three-input look-up tables 104, 106 using standard logic symbols.

The prior art programmable element, and programmable arrays based thereon, are subject to many drawbacks. For example, when attempting to program structures for performing higher-level functions (such as arithmetic and complex logic operations), many logic elements are required to be combined together, which leads to larger structures and reduced performance, including slow carry propagation. However, this is necessary to maintain the ability to perform lower-.level functions. Further, to allow logic elements to be combined together to perform expanded logic operations, combinational logic must be included in each element, even when such operations are not programmed, thus leading to wasteful circuitry. Moreover, the prior art structures can only be statically programmed to perform different levels of functionality.

What is needed in the art, therefore, is a multi-scale programmable logic device that can be dynamically configured to select different scales of functionality. The present invention fulfills this need, among others.

SUMMARY OF THE INVENTION

Accordingly, it is an object of the invention to overcome the abovementioned problems in the prior art.

It is another object of the invention to provide a programmable logic array architecture that allows digital logic to be programmed using both small-scale blocks as well as medium scale blocks.

It is another object of the invention to provide a programmable logic array architecture that can provide multi-scale functionality and maintain high performance.

It is another object of the invention to provide a programmable logic array architecture that can achieve fast carry propagation.

It is another object of the invention to provide a programmable logic array architecture that can provide multi-scale functionality and maintain a single programmable logic element.

It is another object of the invention to provide a programmable logic array architecture that simplifies the programming of complex arithmetic and random logic functions.

It is another object of the invention to provide a programmable logic array architecture that is capable of being dynamically reconfigured to perform different levels of combinational logic functions.

These and other objects of the present invention are fulfilled by a novel architecture for a multi-scale programmable logic array (MSA) to be used in the design of complex digital systems. In the MSA, the static program for the array, stored in configuration memory, defines the functional behavior of each bit-slice circuit and the functional behavior of the ALU controller for a group of bit-slice circuits. These circuits are called the cluster blocks of the architecture. The configuration memory program also controls the flow of logic variables between the cluster blocks.

According to an aspect of the invention, the MSA concept allows digital logic to be programmed using both small-scale blocks (also called gate level blocks) as well as medium scale blocks (also called Register Transfer Level or RTL blocks). Prior art approaches used separate structures to achieve this capability or accepted the reduced performance and increased cost of having a single programmable logic type. The MSA concept is based on a bit sliceable Arithmetic Logic Unit (ALU). Each bit-slice may be programmed to perform a basic Boolean logic operation or to contribute to higher-level functions that are further programmed by an ALU controller circuit. In one embodiment of the invention, the ALU controller level also allows the primitive logic operations computed at the bit-slice level to be combined to perform complex random logic operations. The data shifting capability of this new programmable logic architecture according to another aspect of the invention reduces the complexity of the programmable routing needed to implement shift operations including multiplier arrays. The new array also allows logic variables under program control to dynamically modify the micro-program of each ALU. This technique is called configuration overlay and simplifies the programming of complex arithmetic and random logic functions.

BRIEF DESCRIPTION OF THE DRAWINGS

These and other objects and advantages of the present invention will become apparent to those skilled in the art after considering the following detailed specification, together with the accompanying drawings wherein:

FIG. 21 illustrates a shift control block that can implement the shift control block illustrated in FIG. 19;

FIG. 22 illustrates the "Expanded Logic Mode" of cluster block operation in accordance with another embodiment of the present invention; and FIG. 23 illustrates the "Joined Cell Mode" of cluster block operation in accordance with the another of the present invention.

DETAILED DESCRIPTION OF THE INVENTION

Figure 1:
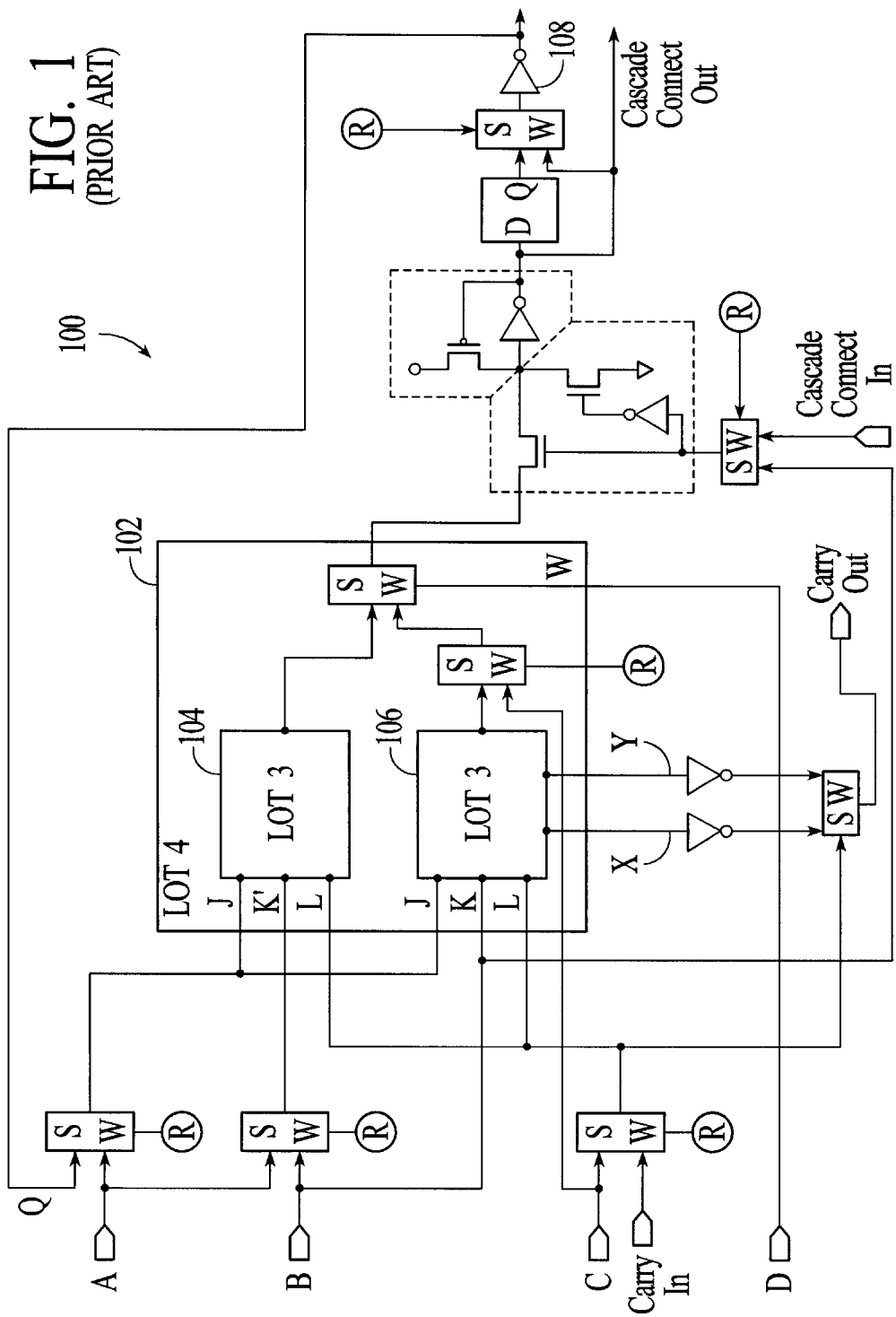
FIG. 1 illustrates a programmable logic element used in a conventional programmable logic device.
Figure 2:
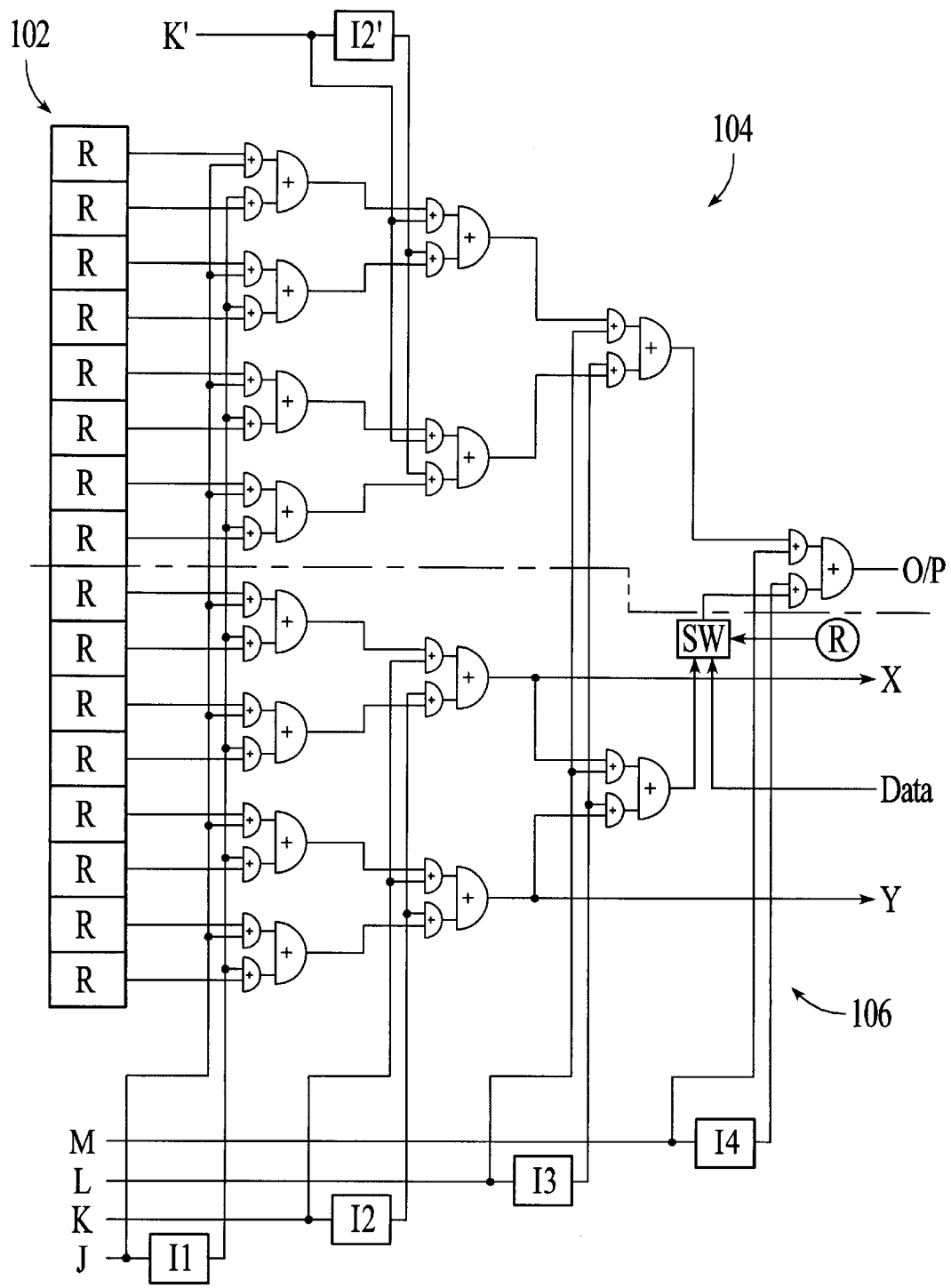
FIG. 2 illustrates how the four-input look-up table is realized as two three-input look-up tables in the conventional programmable logic element in FIG. 1.
Figure 3:
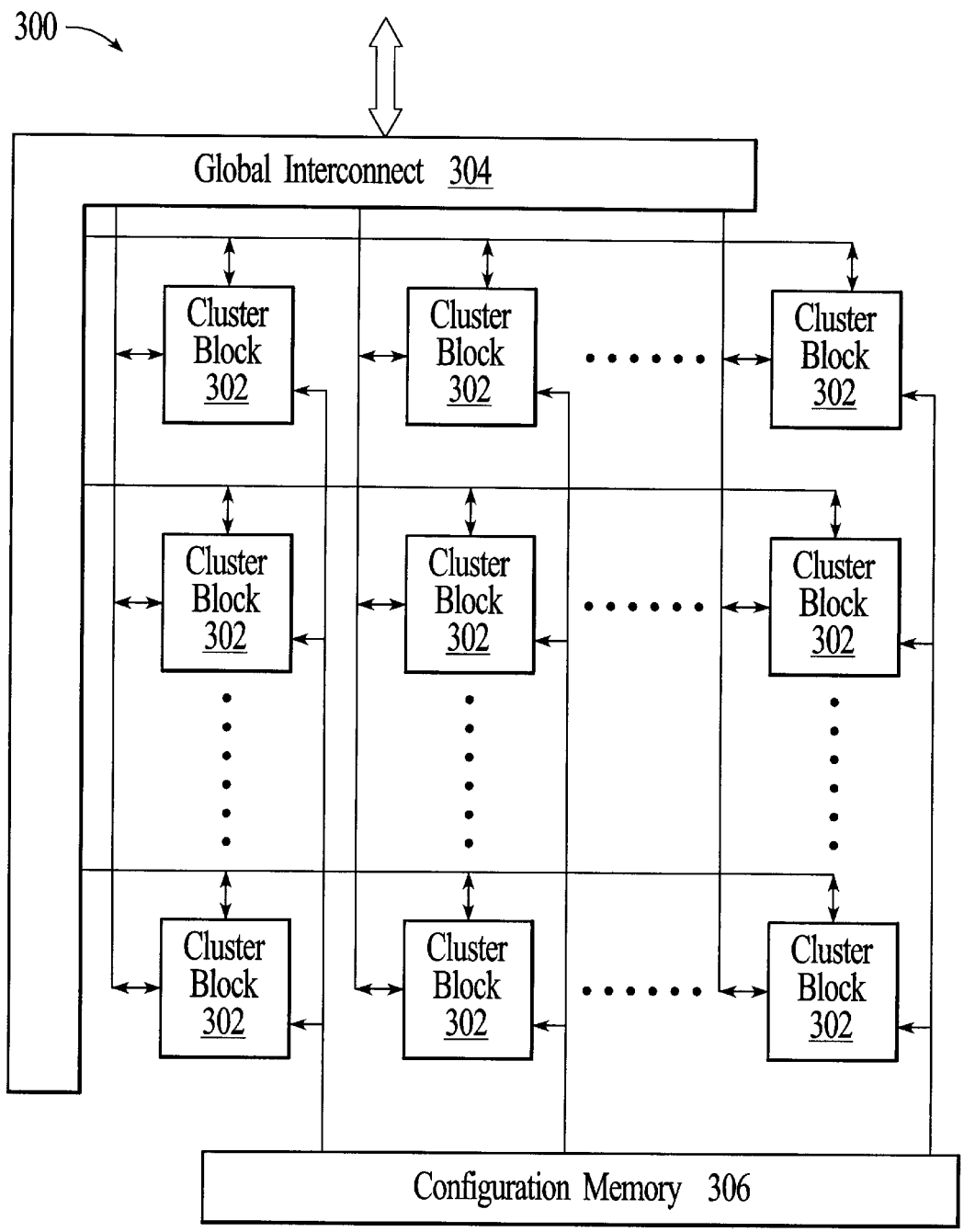
FIG. 3 illustrates a multi-scale programmable logic array (MSA) in accordance with the principles of the present invention.

FIG. 3 illustrates a multi-scale programmable logic array (MSA) 300 in accordance with the principles of the present invention. As shown, array 300 includes a plurality of cluster blocks 302 arranged in rows and columns. Data is communicated between cluster blocks 302 by means of a global interconnect 304. As shown, the global interconnect 304 also communicates data and dynamic configuration information used or output by array 300 with other devices, which data and dynamic configuration information will be described in more detail below. Although generically shown as permitting any two cluster blocks 302 in array 300 to communicate directly with each other via interconnect 304, such interconnections need not be so limited. For example, cluster blocks 302 can additionally or alternatively have interconnections such that blocks in adjacent rows and/or columns communicate directly with each other.

Although not necessarily part of array 300, and preferably separately provided, also shown is configuration memory 306. Memory 306 stores static configurations for array 300. The term "memory" is not intended to be construed as limiting. Rather, memory 306 can have various implementations including CMOS static random access memory (SRAM), fused links and slow speed electrically erasable read only memory (EEPROM).

Figure 4:
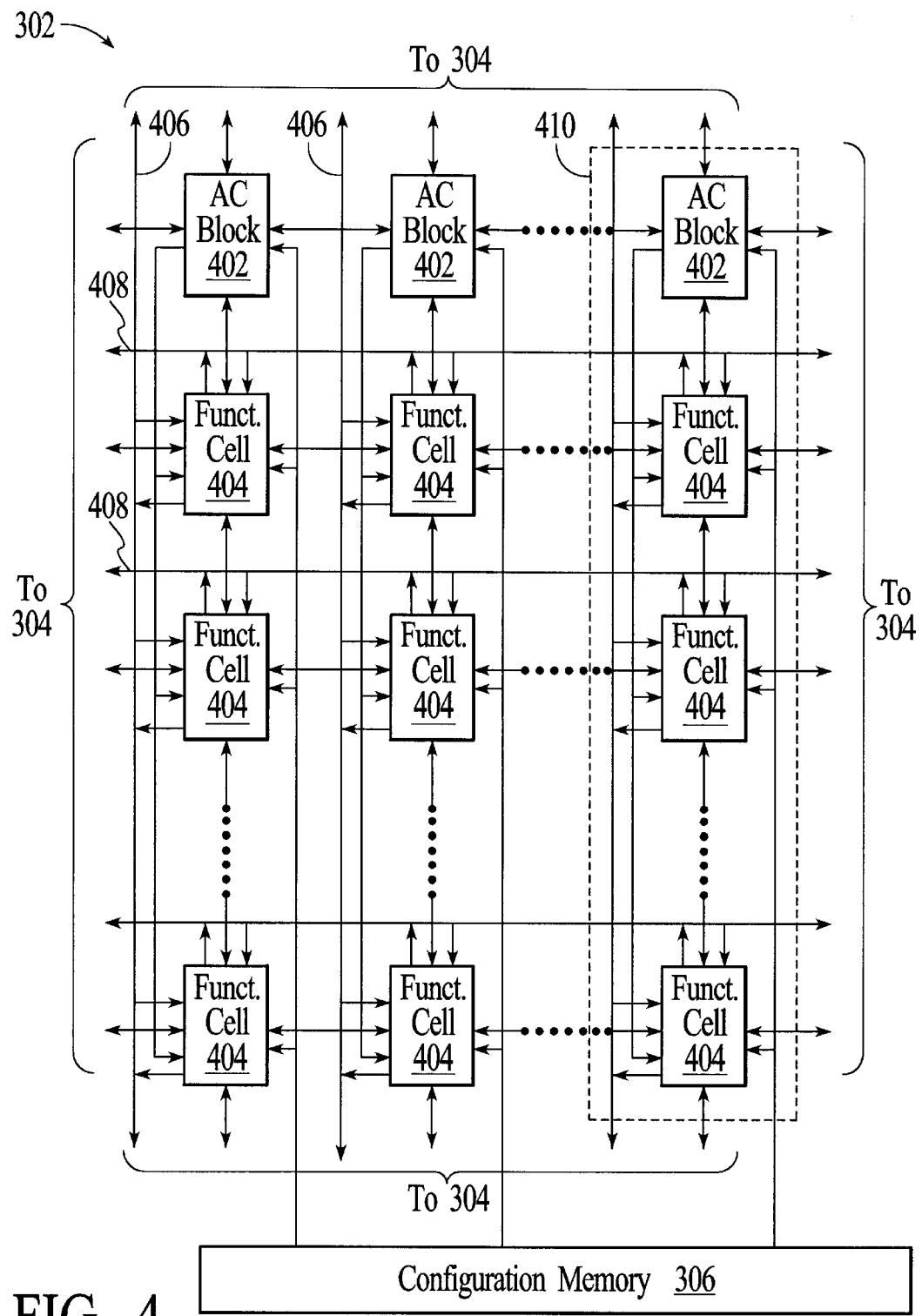
FIG. 4 illustrates an example of a cluster block that can be used to implement one of the cluster blocks illustrated in FIG. 3.

FIG. 4 illustrates a cluster block that can be used to implement cluster block 302 in FIG. 3. As shown, it includes a plurality of ALU controller (AC) blocks 402 and function cells 404. The AC blocks 402 provide configuration signals for a respective column 410 of function cells 404. In one example of the invention, cluster block 302 includes four columns of four function cells 404, each column including one AC block 402.

FIG. 4 shows paths for sharing data and dynamic configuration information between vertically or horizontally adjacent cells 404 within cluster block 302, and with other cluster blocks via global interconnect 304. Also shown are horizontal word lines 408 and vertical word lines 406, by which certain or all of the interior cells 404 may also communicate data with another cluster block 302, which word lines partially implement global interconnect 304.

Figure 5:
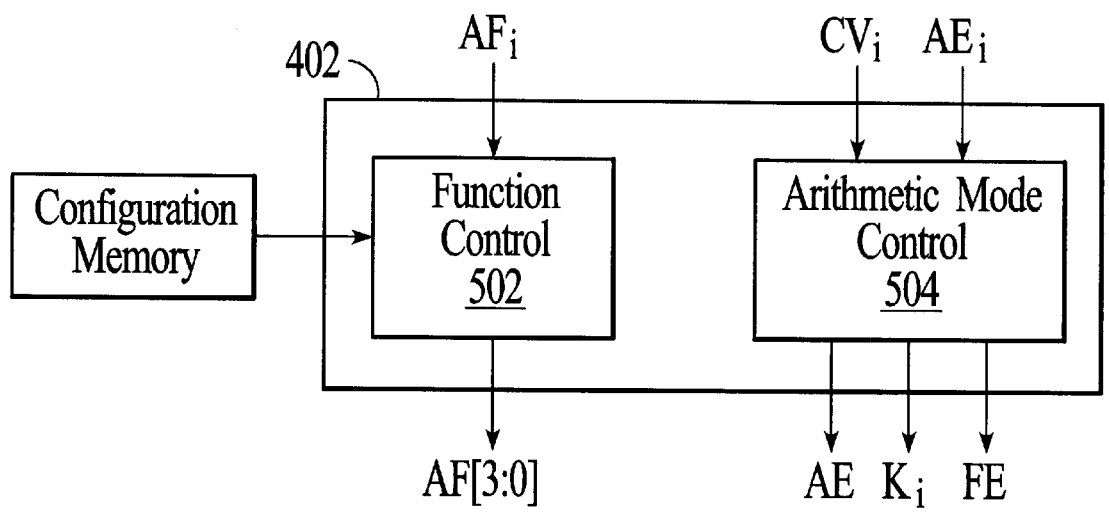
FIG. 5 illustrates an example of an ALU controller that can be used to implement the AC block in FIG. 4.

FIG. 5 illustrates an example of an ALU controller that can be used to implement AC block 402 in FIG. 4. As shown, this example of AC block 402 includes a function control block 502 and an arithmetic mode control block 504.

The function control block 502 includes logic to select the function vector AF[3:0] to be supplied to the column of function cells. The function vector $AF_i$ can be obtained from global interconnect 304, or it may be obtained directly from an adjacent cluster block 302, for example. The particular selection made by function control block 502 may be performed by multiplexers coupled to the global interconnect and adjacent cluster blocks, which multiplexers are controlled in accordance with a program in configuration memory, for example.

It should be noted that the function vector AF[3:0] constitutes dynamic configuration information that is used to implement the function overlay feature of the present invention. This important feature of the invention permits the statically defined operation of the cluster block to be dynamically changed in a manner that is new in the art and that will be described in more detail below.

Figure 6:
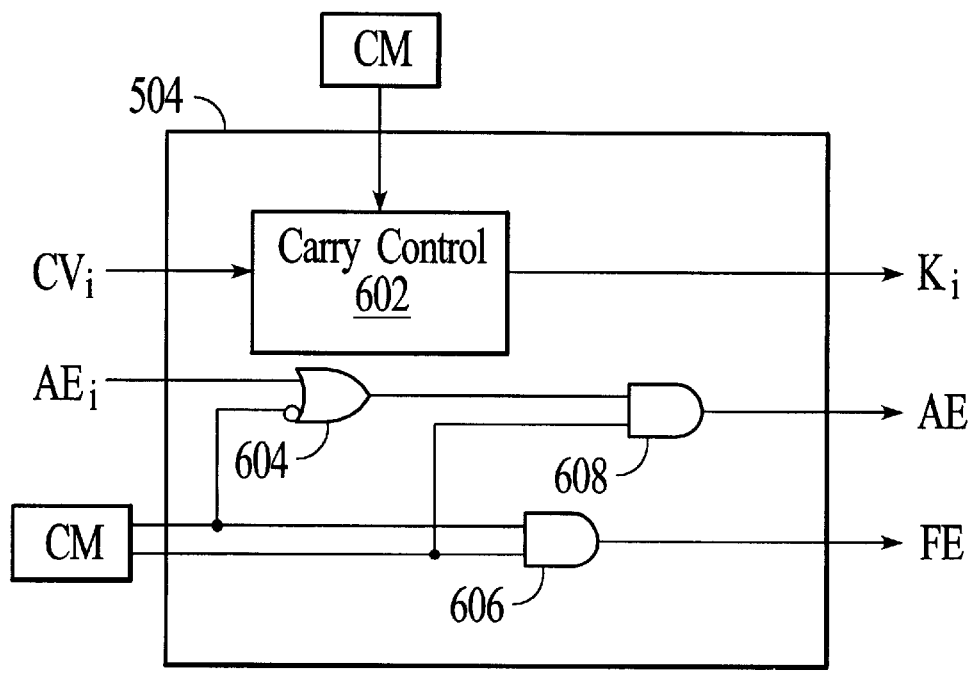
FIG. 6 illustrates an example of an arithmetic mode controller that can be used to implement the arithmetic mode control block in FIG. 5.

FIG. 6 illustrates an example of an arithmetic mode controller that can be used to implement arithmetic mode control block 504. As shown, it includes a carry control block 602, an OR gate with inverted input 604, a first AND gate 606 and a second AND gate 608. As can be seen in this example, the function enable (FE) signal is enabled for the column depending on the program in the configuration memory. As can be further seen, the setting of the arithmetic enable (AE) signal is determined by the configuration memory program and the input signal $AE_i$. Input $AE_i$ is a dynamic configuration signal that is received via the global interconnect 304, for example. Together with the function vector AF[3:0], dynamic control of arithmetic and logic functions performed by a cluster block is permitted.

Carry control block 602 contains logic and connections for selecting a carry input vector $CV_i$ and for outputting a carry signal $K_i$ to be used by the logic cells in its column. The carry input vector represents the carry inputs received by the AC block from all possible sources. The carry control block selects the carry signal $K_i$ from possible sources using multiplexers controlled by a static configuration programmed in configuration memory, for example. For example, the carry input vector $CV_i$ can be selected from the carry output $K_o$ of a preceding cluster block corresponding to a lower order bit-slice block.

Figure 7:
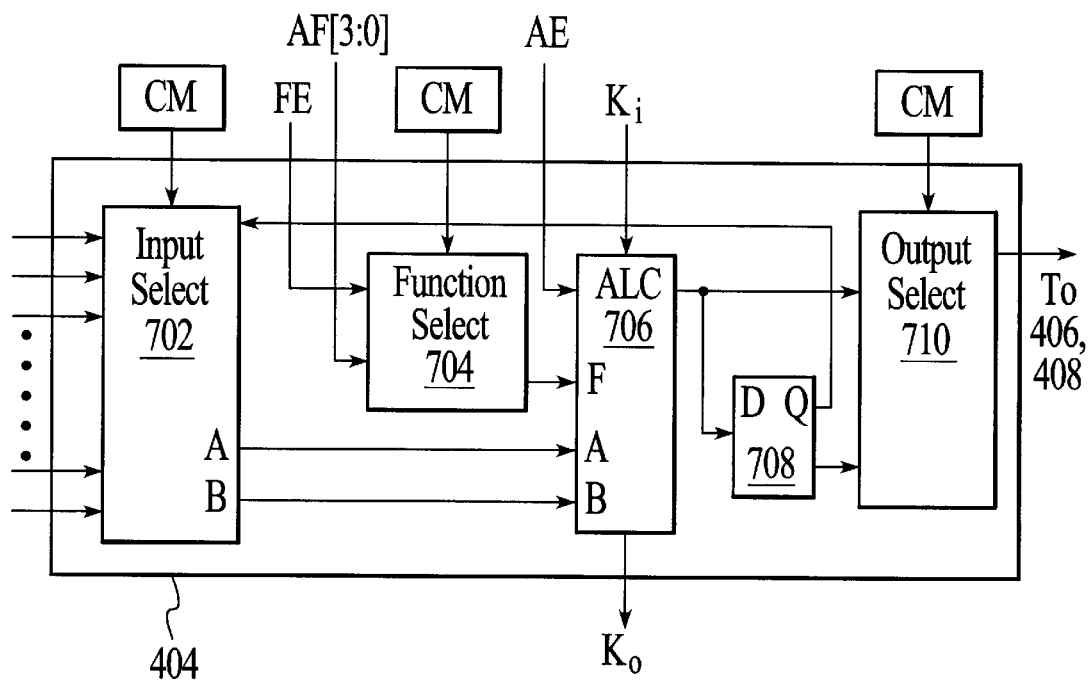
FIG. 7 illustrates an example of a programmable function cell that can be used to implement the function cell illustrated in FIG. 4.

FIG. 7 illustrates an example of a programmable function cell that can be used to implement a function cell 404 in FIG. 4. As shown, function cell 404 includes an input selection block 702, a function selection block 704, an arithmetic logic circuit (ALC) 706, a "Q" register bit flip-flop 708, and an output selection block 710. Function cell 404 performs any function of the inputs A and B, which functions can be both statically and dynamically programmed in a manner that will be described in more detail below.

Input selection block 702 selects the A and B inputs for processing by function selection block 704 in accordance with static configurations set in configuration memory (CM). Block 702 includes logic and interconnections that can select the A and B inputs from adjacent cells in the horizontal and vertical direction, for example, or from neighboring rows or columns of cells, depending on the interconnect scheme employed in the array. For example, block 702 can include multiplexers coupled to word lines 406, 408 and other lines forming global interconnect 304, as well as lines from adjacent function cells, which multiplexers perform selection of inputs based on the program in configuration memory 306. As shown, the Q output from flip-flop 708 can also be selected as one of the A or B inputs, such as in a counter mode.

Function selection block 704 receives a four-bit block function vector (AF) input. and function enable (FE) bit from AC block 402. In response to these inputs, function selection block 704 produces a four-bit cell function vector (F) output according to the program stored in configuration memory (CM). Generally, the function selection block 704 controls the functional behavior of the function cell, which function can be any one of a Boolean function, an arithmetic function and a bitwise gate-level function, as will be described in more detail below.

Figure 8:
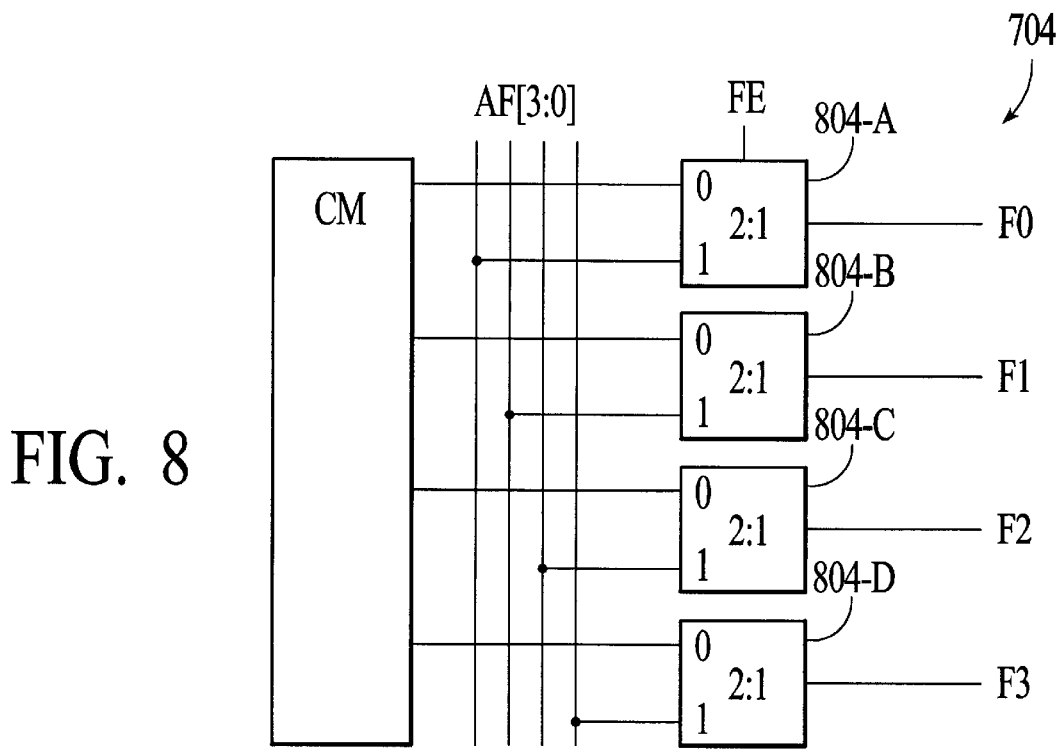
FIG. 8 illustrates an example of a function selection block that can be used to implement the function selection block illustrated in FIG. 7.

FIG. 8 illustrates an example of a function selection block that can be used to implement function selection block 704 in FIG. 7. As shown, it includes four multiplexers 804-A to 804-D. In this example of the invention, if function overlays are enabled (i.e. FE input is set), the dynamically configured input function vector AF[3:0] is selected for output by function select block 704 and use by ALC 706. Otherwise, a stored function vector programmed in configuration memory is selected for use by ALC 706.

ALC 706 performs a function on input logic values A and B, which function is defined by the received F input function vector and the arithmetic enable (AE) bit from the AC block 402, as will be described in more detail below. The carry input and output signals $K_i$ and $K_o$, respectively, are generally communicated with vertically adjacent function cells in the column 410. In general, the ALC is a bit-sliced ALU circuit that can be statically and dynamically programmed to perform both Boolean and arithmetic functions, thus enabling the function overlay and multi-scale functionality aspects of the present invention.

Q flip flop 708 registers the output of the ALC circuit so as to provide feedback to one of the A or B inputs in certain modes. Output section block 710 can include, for example, a multiplexer that selects the combinational output Y of ALC 706 or the registered output from flip flop 708 in accordance with the stored static configuration. Output selection block can also include multiplexers for selectively driving the selected output on one or both of the word lines 406, 408 in accordance with stored configuration information.

Figure 9:
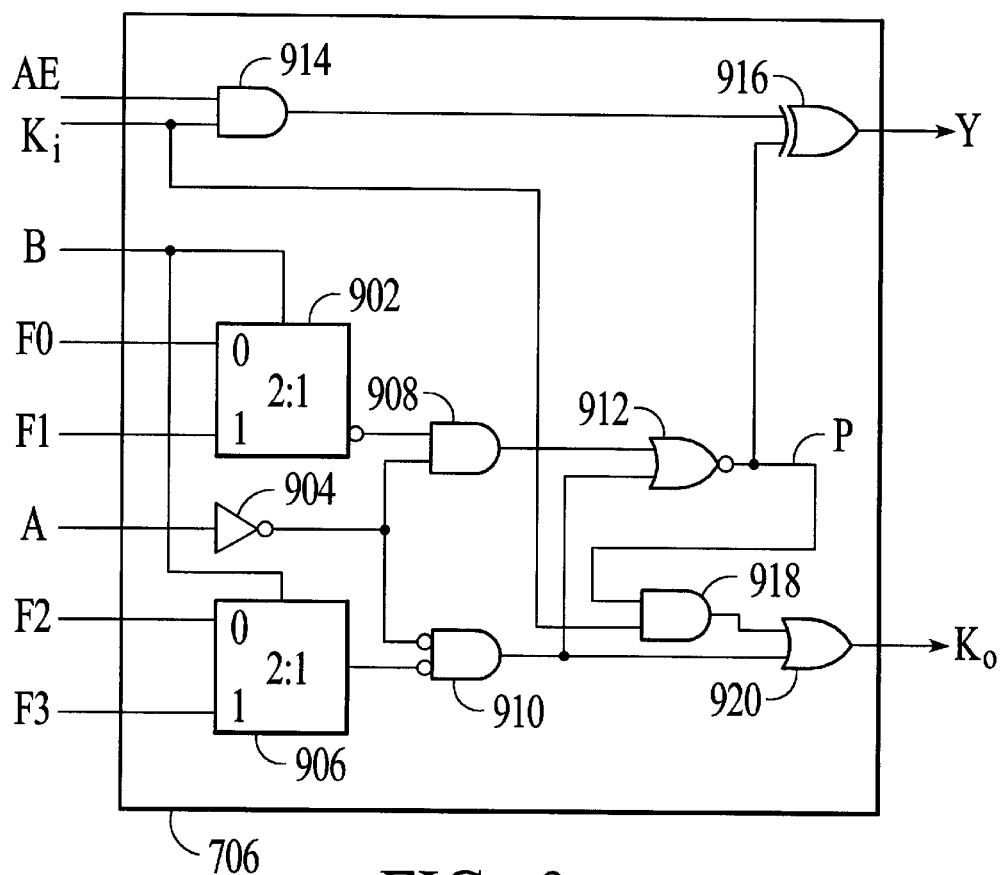
FIG. 9 illustrates an example of the ALU circuit in FIG. 7 in more detail.

FIG. 9 illustrates an example of ALC 706 in more detail. As shown, it includes a 2:1 multiplexer with output inversion 902, an inverter 904, a 2:1 multiplexer 906, an AND gate 908, an AND gate with input inversion 910, a NOR gate 912, an AND gate 914, an XOR gate 916, an AND gate 918 and an OR gate 916. Together, these components produce output logic values Y and $K_o$. based on the data input logic values A and B, as well as the carry input signal $K_i$, the four-bit function vector F and arithmetic enable signal AE.

As can be seen, in this example of ALC 706, the B data input is supplied as a selector signal to multiplexers 902 and 906, which multiplexers each receive two bits of the four-bit function vector F. The selected outputs of multiplexers 902 and 906 are then logically combined with the inverted A data input (via inverter 904) by AND gate 908, AND gate with input inversion 910 and NOR gate 912 to produce the precedent P to result value Y. This precedent value P is logically combined with the result of the AND operation of the arithmetic enable (AE) and carry input ($K_i$) signals (output by AND gate 914) by XOR gate 916 to produce the Y output.

As can be further seen from FIG. 9, the carry input signal $K_i$ is propagated through to carry output signal $K_o$ by AND gate 908 and OR gate 916, which logically combine the carry input signal $K_i$ with Y output precedents P and G, supplied by the outputs of NOR gate 912 and AND gate with input inversion 910, respectively.

Table 1 below defines the logic and arithmetic operations on data inputs A and B that can be performed by ALC 706 as selected by the current function vector "F" and the arithmetic enable signal "AE". If the arithmetic mode is disabled (the AE signal is 0) the ALC performs any of the Boolean functions listed in the left half of the table, with the corresponding values of the Y output for each function. When arithmetic mode is enabled, the ALC computes a corresponding bit of the result of an elementary arithmetic operation on multi-bit quantities A and B, such as add, subtract, increment and decrement, as listed in the right half of the table, along with the corresponding values of the result Y.

TABLE 1

ALU Circuit Operations

| | Logic Mode, AE = 0 | | Arithmetic Mode, AE = 1 | |
|---|---|---|---|---|
| F[3:0] | Operation | Y | Operation | Y |
| 0000 | ZERO | 0 | SHL | $2*A + K_i$ |
| 0001 | NOR | (A \| B)' | — | (undefined) |
| 0010 | INHA | A'&B | — | (undefined) |
| 0011 | NOTA | A' | DEC | $A - K_i'$ |
| 0100 | INHB | A&B' | — | (undefined) |
| 0101 | NOTB | B' | — | (undefined) |
| 0110 | XOR | A^B | ADD | $A + B + K_i$ |
| 0111 | NAND | (A&B)' | — | (undefined) |
| 1000 | AND | A&B | — | (undefined) |
| 1001 | XNOR | (A^B)' | SUB | $A - B + K_i'$ |
| 1010 | B | B | — | (undefined) |
| 1011 | IMPA | A' \| B | — | (undefined) |
| 1100 | A | A | INC | $A + K_i$ |
| 1101 | IMPB | A \| B' | — | (undefined) |
| 1110 | OR | A \| B | — | (undefined) |
| 1111 | ONE | 1111 | CON | $K_i - 1$ |

As should be apparent to those of skill in the art, Table 1 is a minor variation of the original '74181 function table. It should be further apparent to those skilled in the art that ALC 706 may be implemented by many different combinations of logic elements other than those presented in FIG. 9, which different combinations could also perform the functions according to Table 1. Accordingly, the example implementation given in FIG. 9 should not be considered limiting.

The differences between the structure of the ALC 706 of the present invention and the lookup tables used in the prior art should be readily apparent. Importantly, the ALC 706, which is the basic structure of the function cell, is a bit-sliced ALU, which is significantly different than a lookup table. That is, it is constructed to perform complex ALU functionality, and does not depend on a configuration stored in memory to perform ALU functions, as does a lookup table. Moreover, while the prior art required several cells chained together to perform an ALU function, the present invention permits a single function cell to perform a bit of an ALU computation. Meanwhile, the structure of the ALC 706 permits performance of lower-level Boolean and gate-level operations in addition to the ALU functionality by a dynamic setting of the input AE flag. Thus, a reprogramming of the array is not required to cause the ALC 706 to implement functions of different logic complexity. In this way, the ALC 706 is a "multi-scale" function cell.

The operation and advantages of the multi-scale programmable logic array of the present invention will now be described with reference to several examples.

Figure 10:
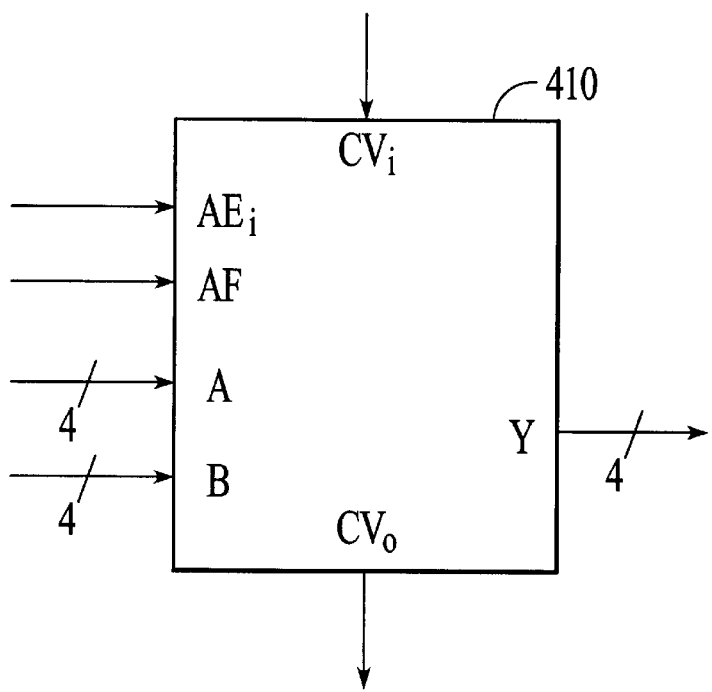
FIG. 10 illustrates a cluster block operating in "General ALU mode" according to an aspect of the invention.

FIG. 10 illustrates a column 410 of a cluster block operating in "General ALU mode." In this mode, the program for each cluster block stored in configuration memory is set to cause function overlays to be enabled (i.e. the FE bit is set). Accordingly, the four-bit AF function vector may be received and used to overlay the statically defined operation of each cell. This will cause each function cell in cluster block to commonly compute one bit-slice of an arithmetic (e.g. if AE is set to 1) or Boolean vector (e.g. if AE is set to 0) operation on two four-bit values A and B. This capability permits micro-programmed operation of very complex functions in a single ALU. It should be apparent that such micro-programs can be extended to operate on A and B inputs having greater bit widths than four by commonly operating more than one cluster block with the same function, and by communicating the carry values $CV_i$ and $CV_o$ (which in this example can be simply the $K_i$ and $K_o$ signals of the most significant and least significant function cells, respectively, of the cluster block) between the commonly operated cluster blocks.

Figure 11:
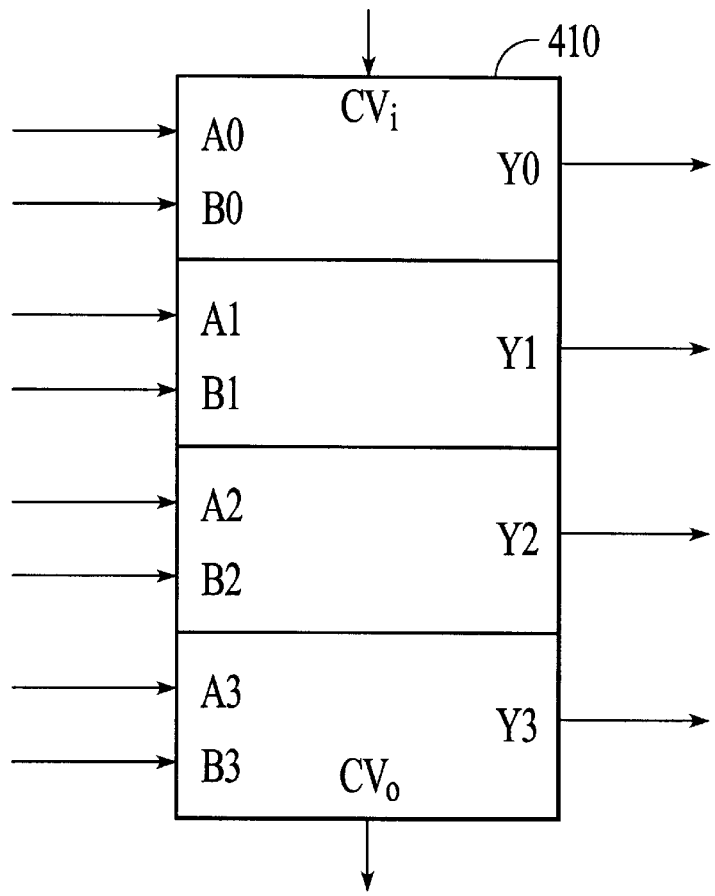
FIG. 11 illustrates the "Static Arithmetic Mode" of cluster block operation according to an aspect of the invention.

FIG. 11 illustrates the "Static Arithmetic Mode" of cluster block operation according to the invention. In this mode, the program for the cluster block stored in configuration memory is set to cause function overlays to be disabled (i.e. the FE bit is not set), and the arithmetic mode is always enabled (i.e. the AE bit is set). Accordingly, each function cell in the cluster block column 410 performs an independent bit-wise arithmetic function (i.e. one of the arithmetic functions listed in Table 1) according to its program stored in configuration memory.

Figure 12:
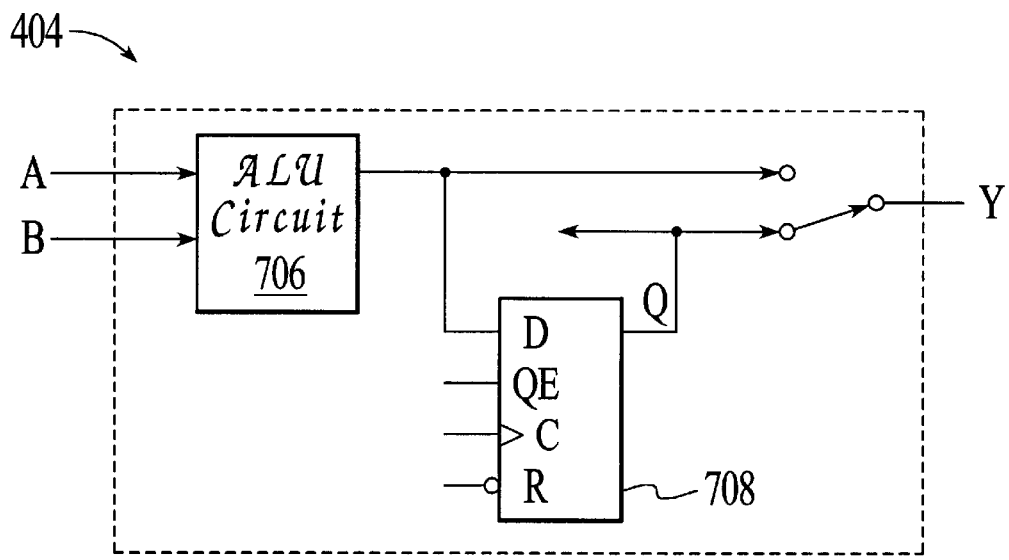
FIG. 12 illustrates the "Gate Level Mode" of cluster block operation according to this example of the invention.

FIG. 12 illustrates the "Gate Level Mode" of cluster block operation according to this example of the invention. In this mode, the program for the cluster block stored in configuration memory is set to cause function overlays to be disabled (i.e. the FE bit is not set), and the arithmetic mode is always disabled (i.e. the AE bit not set). Accordingly, the ALU circuit in each function cell is independently configured to realize any function of two input signals A and B (i.e. one of the logic functions listed in Table 1). The function cell output Y may be configured to be output directly from the ALU circuit, or it may be obtained from the registered ALU output. The register bit may be fed back into the ALU circuit as one of the A or B inputs to realize counters, accumulators and so forth. Clocks and reset signals for the register may be provided by the AC block, for example.

A first alternative embodiment of the invention will now be described. In this example, cluster block 302 includes additional functionality for permitting different static programs to be dynamically selected, and for different functions of three variables to be performed.

Figure 13:
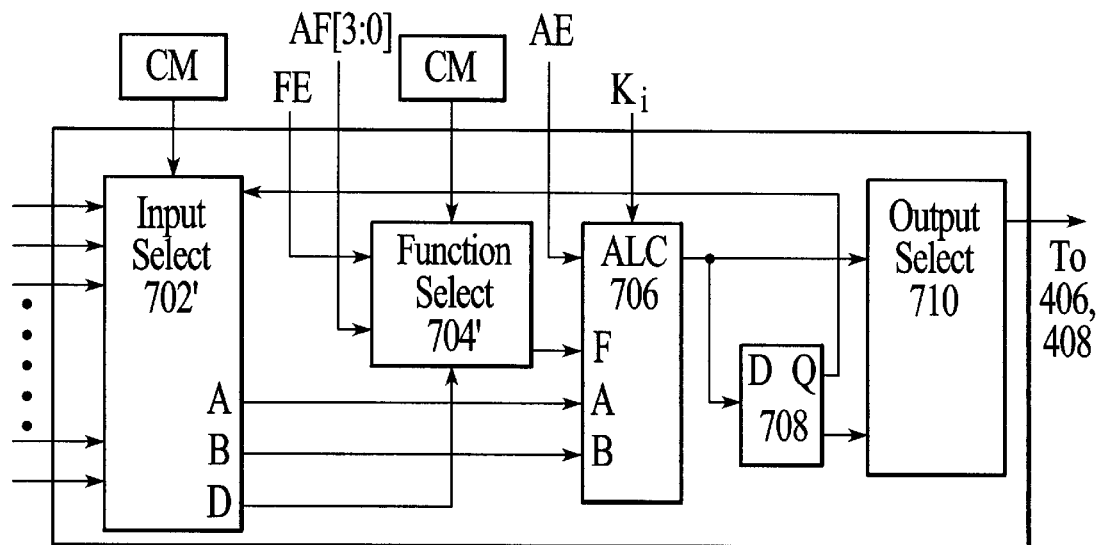
FIG. 13 illustrates an alternative example of a programmable function cell that can be used to implement the function cell illustrated in FIG. 4 in accordance with another embodiment of the invention.

FIG. 13 illustrates another example of a programmable function cell that can be used to implement a function cell 404 in FIG. 4. As shown, function cell 404' includes an alternative input selection block 702' and function selection block 704' such that an additional D input is processed. Function cell 404' thus performs any function of the inputs A, B and D, which functions can be both statically and dynamically programmed in a manner that will be described in more detail below.

In this alternative embodiment of the invention, input selection block 702' also includes logic and connections, such as multiplexers coupled to word lines, for example, to select the D input, from neighboring cells or rows or columns, for example. The D input can be used to construct complex arithmetic operations such as a multiplier stage or for complex logic operations such as multiplexer switches, as will be described in more detail below.

Function selection block 704' receives the D input from the input selection block in addition to the four-bit block function vector (AF) input and function enable (FE) bit from AC block AC 402. In response to these inputs, function selection block 704' produces a four-bit cell function vector (F) output according to the program stored in configuration memory (CM).

Figure 14:
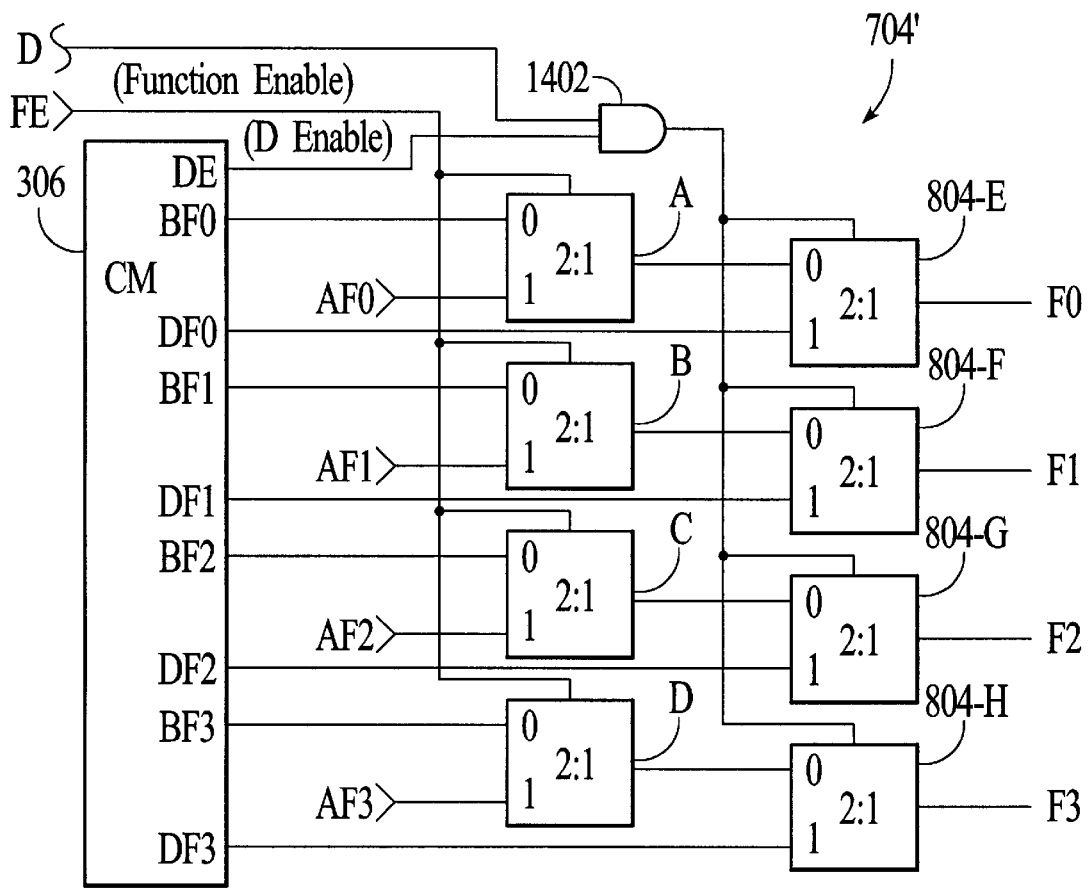
FIG. 14 illustrates an alternative example of a function selection block that can be used to implement the function selection block illustrated in FIG. 13 in accordance with another embodiment of the invention.

FIG. 14 illustrates another example of a function selection block that can be used to implement function selection block 704' in FIG. 13. As shown, it includes an AND gate 1402 and four additional multiplexers 804-E to 804-H. As can be seen, in this example of the invention, if functions are enabled (i.e. FE input is set) and the D input is zero or not enabled (i.e. DE in configuration memory programmed to zero), the input function vector AF[3:0] is selected for output by function select block 704' (via AND gate 1402 and multiplexers 804-A to 804-H) and use by ALC 706. Otherwise, one of two stored function vectors programmed in configuration memory are selected for use by ALC 706 (via multiplexers 804-A to 804-H), as determined by the D and DE bits.

Figure 15:
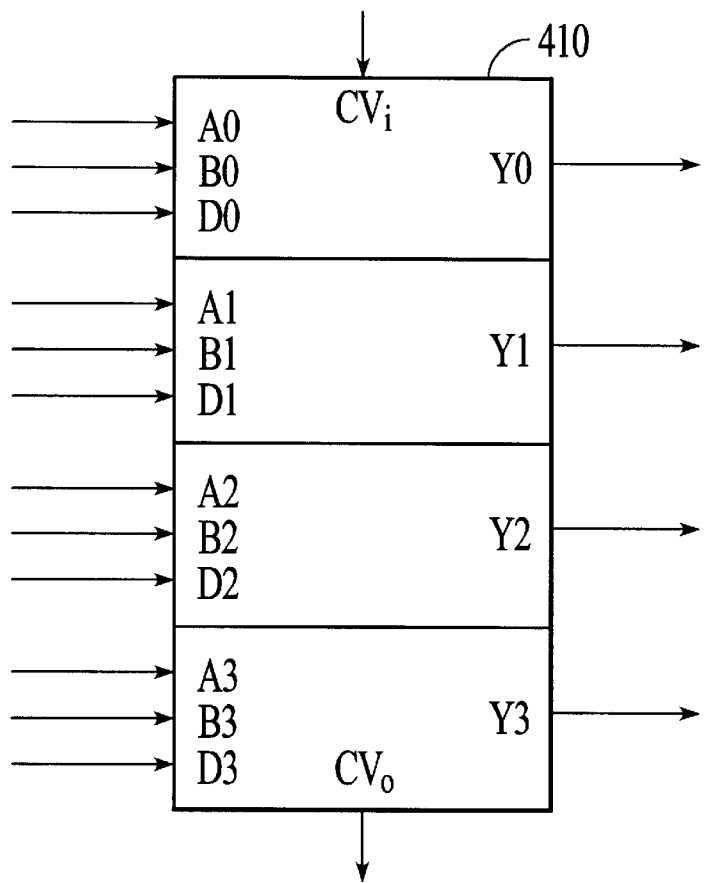
FIG. 15 illustrates the "Static Arithmetic Mode" of cluster block operation according to another aspect of the invention.

FIG. 15 illustrates the "Static Arithmetic Mode" of cluster block operation according to this alternative embodiment of the invention. In this embodiment, the D input is used to select between programs stored in configuration memory, and thus enables functions of three input variables.

Figure 16:
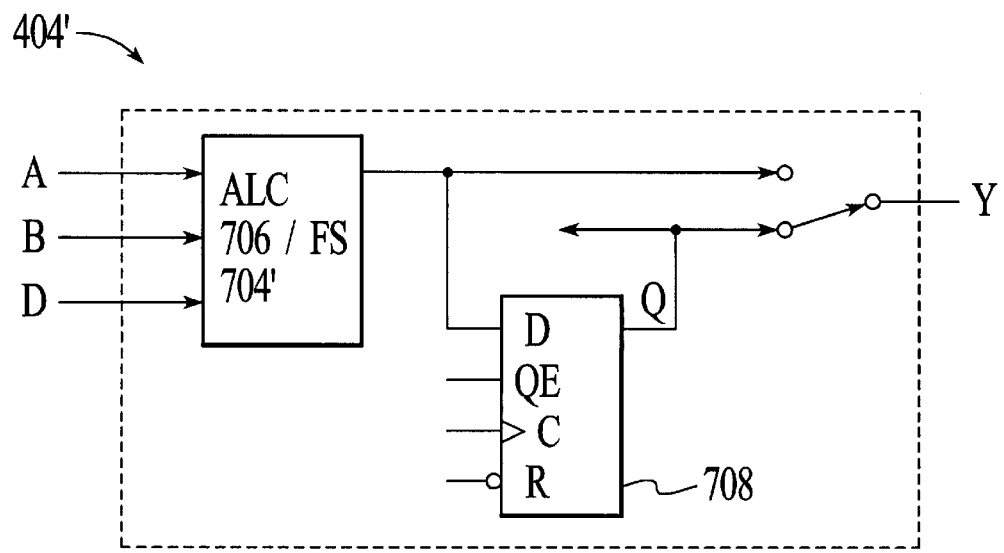
FIG. 16 illustrates the "Gate Level Mode" of cluster block operation according to another example of the invention.

FIG. 16 illustrate the "Gate Level Mode" of clust lock operation according to this alternative example of the invention. In this alternative, the ALU circuit 706 and function select circuit 704' in each function cell operate together to realize any function of three input signals A, B and D.

A second alternative embodiment of the invention will now be described. In this example, cluster block 302 includes additional functionality for permitting shift and join operations between function cells, thus allowing additional modes of operation and extended functionality, as will be described in more detail below.

Figure 17:
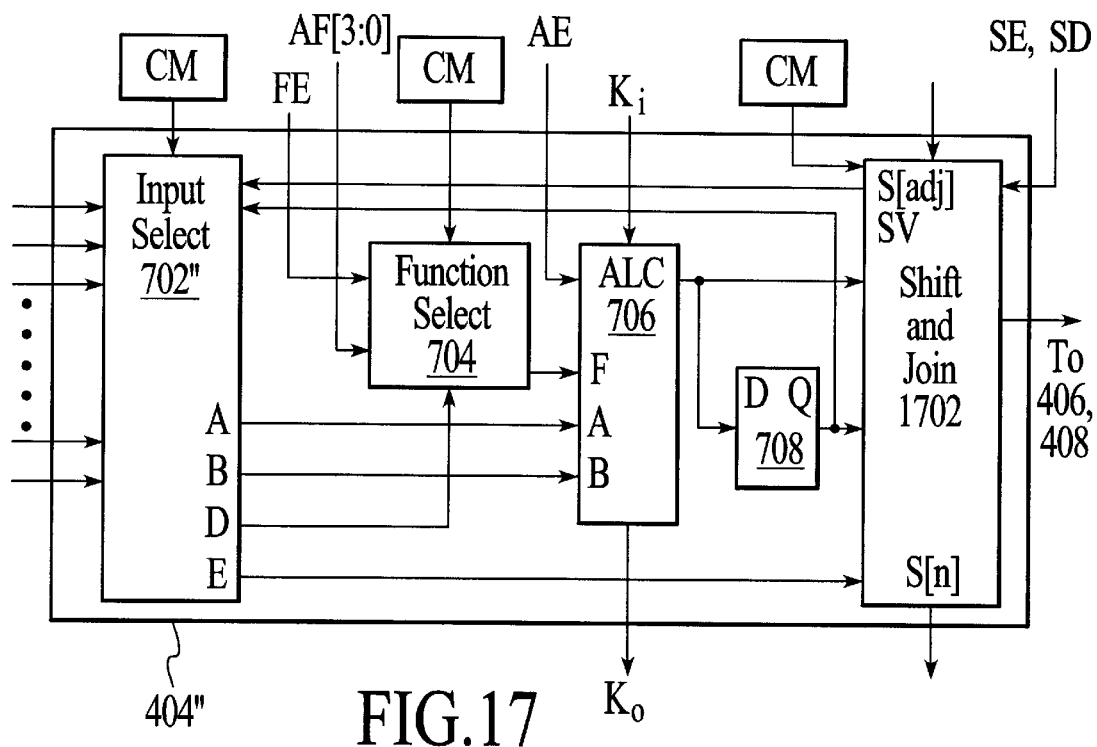
FIG. 17 illustrates an further alternative example of a function cell that can implement the function cell illustrated in FIG. 4 according to another embodiment of the invention.

FIG. 17 illustrates a second alternative example of function cell 404" that can implement function cell 404 in FIG. 4 according to this embodiment of the invention. In this example, function cell 404" additionally includes a shift and join block 1702 in place of output selection block 710. Function cell 404" also includes a second alternative input selection block 702".

Input selection block 702" according to this alternative embodiment of function cell 404" includes additional functionality and logic, which can be multiplexers controlled by programmed bits in configuration memory, for example, for selecting the E input, from horizontally or vertically adjacent function cells, for example. The input select circuit 702" additionally includes logic for selecting a shift value from the shift and join block 1702 for use as one of the inputs to ALC 706. The E input is a dynamic configuration signal in addition to the D input, that selects whether the function cell output Y is taken from the ALU circuit 706 or from one of the shift inputs, as will be explained in more detail below.

Figure 18:
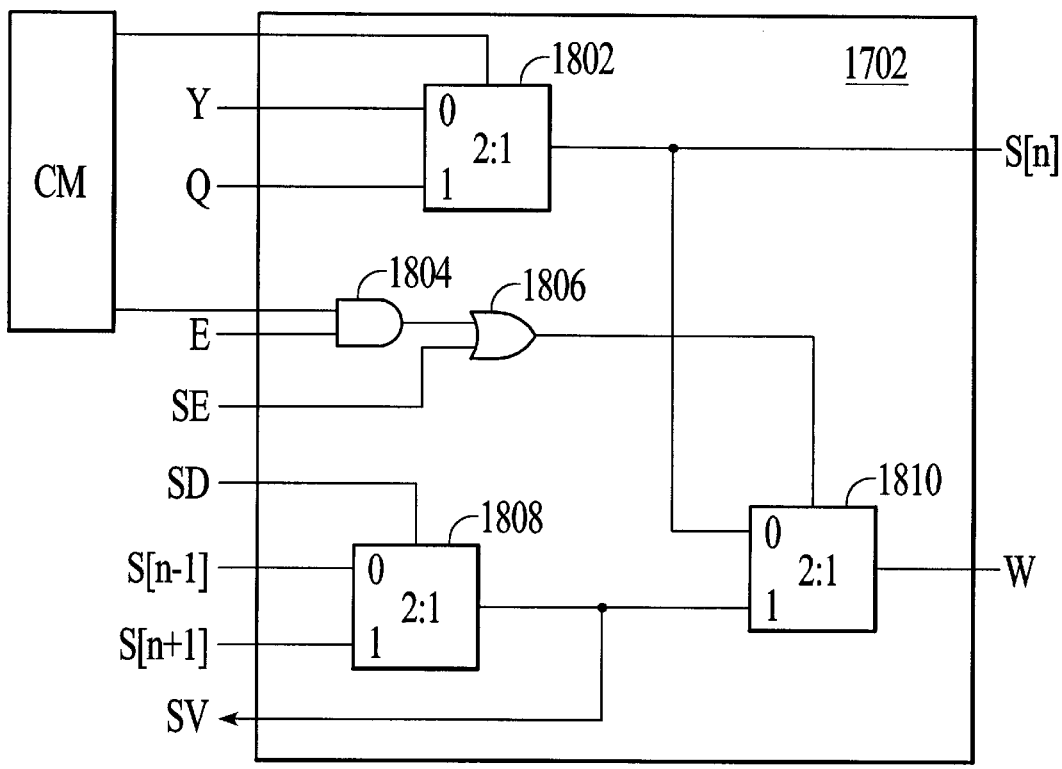
FIG. 18 illustrates a shift and join block that can implement the shift and join block illustrated in FIG. 17.

FIG. 18 illustrates a shift and join block that can implement shift and join block 1702 in FIG. 17. As shown, it includes 2:1 multiplexer 1802, AND gate 1804, OR gate 1806, 2:1 multiplexer 1808 and 2:1 multiplexer 1810. In this example of the invention, connections between vertically adjacent function cells and the AC block in a column of cells 410 further include shift lines, which shift lines enable additional functionality that will be described in more detail below. Preferably, each function cell in a column 410 drives one corresponding shift line S, and the AC block drives a shift line SL. In the example where there are four function cells in each column, there are four shift lines S[3:0] and AC block shift line SL.

Multiplexer 1802 selects either the Y output from ALC circuit 706 or the Q output from flip-flop 708 for output on the shift line S[n] for this cell. The selection is made in accordance with the configuration programmed in configuration memory.

Multiplexer 1808 enables receipt of either of shift line inputs S[n−1] and S[n+1] from vertically adjacent function cells in the column 410 or in adjacent columns in accordance with the SD input from the AC block (described in more detail below). The selected shift line input SV can be fed back to the input selection block 702" for possible use by ALC 706.

Multiplexer 1810 selects for output on word line W from either the current or previous outputs from ALC circuit 706, or the selected shift line input. The selection by multiplexer 1810 is in accordance with the SE input from the AC block and the dynamic configuration signal E input (if enabled in this configuration). More particularly, if shift is enabled by either the AC block or by the dynamic configuration signal, the shift input is placed for output on word line W (406, 408). Otherwise, the output from the ALC circuit is placed for output on word line W (406, 408).

Figure 19:
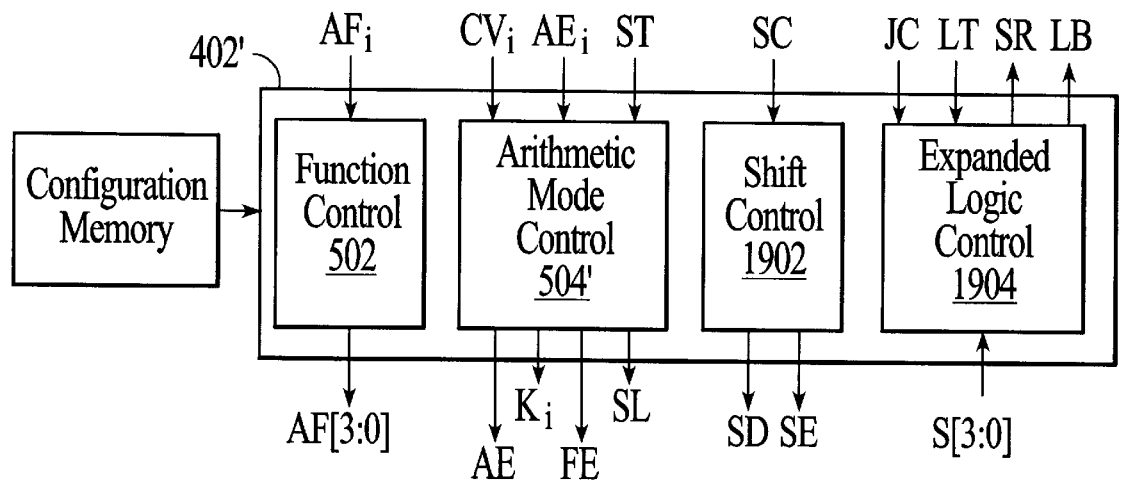
FIG. 19 illustrates an alternative example of an AC block that can implement the AC block in FIG. 4 according to another embodiment of the invention.

FIG. 19 illustrates an alternative example of AC block 402' that can implement AC block 402 in FIG. 4 according to the second alternative embodiment of the invention. As shown, AC block 402' additionally includes a shift control block 1902 and an expanded logic control block 1904. AC block 402' also includes an alternative example of arithmetic mode control block 504'. Generally, the alternative AC block 402' includes additional functionality for receiving shift inputs from adjacent columns or cluster blocks, and for receiving, cascading and producing expanded logic outputs from multiple cells and blocks of cells.

Figure 20:
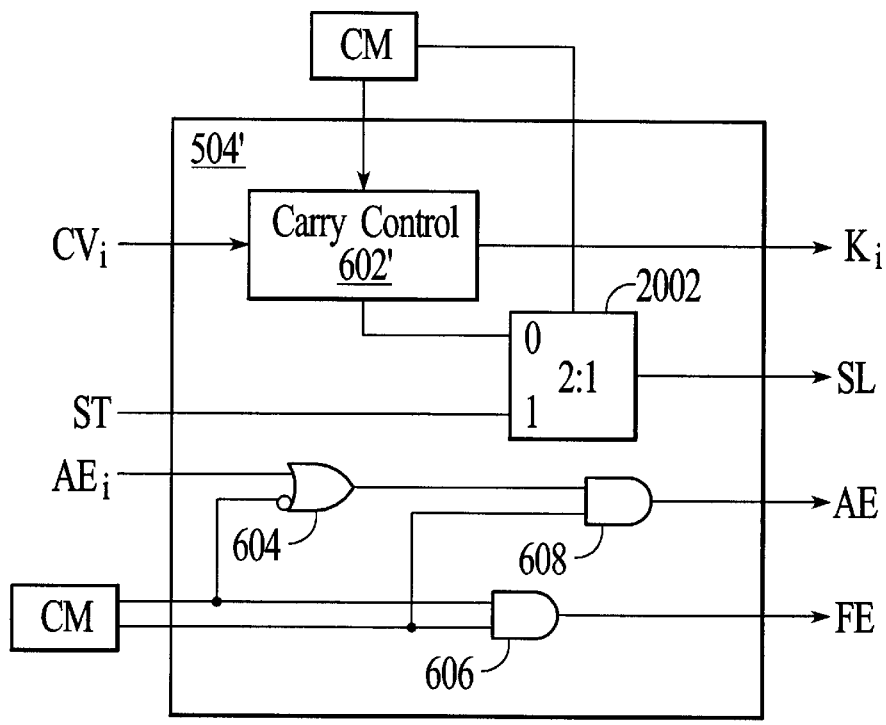
FIG. 20 illustrates an alternative arithmetic mode control block that can implement the arithmetic mode control block illustrated in FIG. 19.

FIG. 20 illustrates an alternative arithmetic mode control block that can implement arithmetic mode control block 504' in FIG. 19. As shown, arithmetic mode control block 504' additionally includes 2:1 multiplexer 1602 for selecting between a carry value obtained from carry control block 602' and a shift value input ST from adjacent columns or cluster blocks, for example, for application as the shift line input value SL for this cluster block.

FIG. 21 illustrates a shift control block that can implement shift control block 1902 in FIG. 19. As can be seen, the shift enable (SE) bit is determined by a logical combination (via logic elements 2102) of the program stored in configuration memory and the user supplied shift control (SC) signal D2 and the shift direction (SD) bit is determined by a logical combination (via logic elements 2104) of the program stored in configuration memory and the user supplied shift control (SC) signal D3. Shift control block 1902 thus permits both dynamic and static control of shift functions.

Expanded logic control block 1904 receives the shift line outputs from each of the function cells in the cluster block (S[0:3]) and logically combines them in accordance with dynamic join control signals JC and configurations programmed in configuration memory and causes a logic output LB to be produced. This functionality is useful for expanded logic operations such as Shannon logic expansion, Boolean products and sums, and parity or modulo-2 sums. The actual structure within block 1904 for implementing the functionality will depend on the operations performed, and those of skill in the art do not need a detailed explanation of such structure to understand the present invention. Expanded logic block also receives expanded logic results LT from other columns and cluster blocks, for example, which can be further combined to produce the logic expansion result LB.

Expanded logic control block 1904 further produces the output shift signal SR based on shift line outputs S[3:0] from the function cells for receipt by adjacent columns or cluster blocks.

The additional operations of the multi-scale programmable logic array of the above-described alternative embodiment of the present invention will now be described with reference to several examples.

FIG. 22 illustrates the "Expanded Logic Mode" of cluster block operation in accordance with the alternative embodiment of the present invention. In this mode, the function mode is always disabled (i.e. FE is zero), and arithmetic mode is always disabled (i.e. AE is zero). Accordingly, the function performed by each bit-slice function cell is configured independently. Additionally, the results S[3:0] for each function cell can be brought up to the AC block 402' for further combination into a result output on the LB output. Preferably, the expanded logic operations supported include:

1. Shannon logic expansion; a four to one mux is used with two user defined selection signals JC to implement any function of five variables and a large number of useful functions of up to 14 variables. This also allows the direct implementation of an eight to one mux in one ALU as well as a powerful "complex gate" capability.
1. Boolean Product: logical AND of the four output signals.
1. Boolean Sum: logical OR of the four output signals.
1. Parity or Mod-2 Sum: exclusive-OR of the four output signals.

The expanded logic mode result of column 410 may also be combined with the result LT of other cluster blocks to produce logic results LB that create ever more complex Boolean functions.

The individual results from all the function cells may also be made available to adjacent blocks via word lines W, as shown in FIG. 18.

FIG. 23 illustrates the "Joined Cell Mode" of cluster block operation in accordance with the alternative embodiment of the present invention. In this mode, the user-supplied E input signal becomes a selection signal so that the value of the output W is either the output value of the function cell's (404"-U) own ALU circuit, or is the word line W output value from the lower function cell 404"-L. This functionality can be exploited to implement any function of four variables and a large number of useful functions of up to seven variables. For example, two function cells can be used to implement a four to one multiplexer. This functionality can also be exploited for implementing state machines.

Although the present invention has been described in detail with reference to the preferred embodiments thereof, those skilled in the art will appreciate that various substitutions and modifications can be made to the examples described herein while remaining within the spirit and scope of the invention as defined in the appended claims.

What is claimed is:

1. A programmable logic device, comprising:
a function cell that provides a result logic value in response to one or more input logic values and a function vector, the function cell being operable to receive the function vector both from a configuration memory and from dynamic configuration signals, wherein the function cell includes a function selection block that is operable to selectively receive the function vector in response to a received function overlay enable signal.

2. A programmable logic device according to claim 1, wherein the function selection block is further operable to selectively receive the function vector from among a plurality of stored function vectors based on a received dynamic selection signal.

3. A programmable logic device according to claim 1, further comprising a controller block coupled to the function cell that is operable to receive the dynamic configuration signals from a global interconnect and to provide the dynamic configuration signals and the function overlay signal to the function cell.

4. A programmable logic device according to claim 1, wherein the function cell further includes an arithmetic logic circuit that receives the function vector from the function selection block, the arithmetic logic circuit being operable in a first mode to provide the result logic value as an arithmetic combination of the input logic values and operable in a second mode to provide the result logic value as a logical combination of the input logic values, the arithmetic combination and the logical combination both determined by the function vector.

5. A programmable logic device, comprising:
a plurality of function cells that provide result logic values in response to one or more input logic values and a function vector, the function cells being operable to receive respective stored function vectors from a configuration memory and a dynamic function vector; and
a controller block coupled to the function cells that is operable to receive dynamic configuration signals and to commonly provide the dynamic function vector to the function cells.

6. A programmable logic device according to claim 5, wherein the function cells correspond to respective bit positions in a multi-bit operation, the dynamic function vector causing the plurality of function cells to perform respective bit-wise operations in the multi-bit operation.

7. A programmable logic device according to claim 6, wherein the function cells further provides a carry output in response to the input logic values, the function vector and a carry input.

8. A programmable logic device according to claim 7, wherein the multi-bit operation is one of an add, a subtract, an increment, and a decrement operation.

9. A programmable logic device according to claim 6, wherein the multi-bit operation is one of an add, a subtract, an increment, and a decrement operation.

10. A programmable logic device according to claim 6, wherein the multi-bit operation is one of a NOR, an XOR, a NAND, an AND, an XNOR and an OR operation.

11. A programmable logic device, comprising:
a plurality of function cells that each provide a respective result logic value in response to one or more input logic values and a function vector; and
a controller block coupled to the function cells that is operable to receive the respective result logic values and to logically combine them to produce an expanded logic value.

12. A programmable logic device according to claim 11, wherein the controller block further receives another expanded logic value from another plurality of function cells and is operable to combine the another expanded logic value with the respective result logic values to produce the expanded logic value.

13. A programmable logic device according to claim 11, wherein the function cells include a shift and join block, the shift and join block being operable to selectively cause an associated one of the function cells to output the respective result logic value of the associated function cell, or to output the respective result logic value of an adjacent function cell.

14. A programmable logic device, comprising:
a plurality of cluster blocks that communicate via a global interconnect, the cluster blocks including:
a controller block coupled to the global interconnect for receiving dynamic configuration signals and for providing an arithmetic mode signal in response;
a plurality of function cells that receive the arithmetic mode signal from the controller and provide a respective result logic value in response to one or more input logic values and a function vector, each function cell having an arithmetic logic circuit that in a first mode is operable to provide the result logic value as an arithmetic combination of the input logic values and in a second mode is operable to provide the result logic value as a logical combination of the input logic values, the arithmetic combination and the logical combination both determined by the function vector, the first and second mode being determined by the arithmetic mode signal.

15. A programmable logic device, comprising:

a plurality of cluster blocks that communicate via a global interconnect, the cluster blocks including:

a plurality of function cells that provide result logic values in response to one or more input logic values and a function vector, the function cells being operable to receive respective stored function vectors from a configuration memory and a dynamic function vector; and a controller block coupled to the function cells that is operable to receive dynamic configuration signals and to commonly provide the dynamic function vector to the function cells in response.

* * * * *